(12) United States Patent
Libbert et al.

(10) Patent No.: US 8,143,078 B2
(45) Date of Patent: Mar. 27, 2012

(54) METHODS FOR MONITORING THE AMOUNT OF CONTAMINATION IMPARTED INTO SEMICONDUCTOR WAFERS DURING WAFER PROCESSING

(75) Inventors: Jeffrey L. Libbert, O'Fallon, MO (US); Lu Fei, St. Louis, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 12/970,139

(22) Filed: Dec. 16, 2010

(65) Prior Publication Data

US 2011/0151592 A1    Jun. 23, 2011

Related U.S. Application Data

(60) Provisional application No. 61/289,878, filed on Dec. 23, 2009.

(51) Int. Cl.
*H01L 21/66* (2006.01)
*H01L 21/302* (2006.01)

(52) U.S. Cl. .......... 438/16; 438/754; 257/E21.527; 257/E21.53

(58) Field of Classification Search ............ 438/14, 438/16, 754; 257/E21.527, E21.53
See application file for complete search history.

(56) References Cited

U.S. PATENT DOCUMENTS

| | | | |
|---|---|---|---|
| 5,189,500 A | 2/1993 | Kusunoki | |
| 5,436,175 A | 7/1995 | Nakato et al. | |
| 6,258,613 B1 | 7/2001 | Iwamatsu | |
| 6,613,638 B2 | 9/2003 | Ito | |
| 6,790,747 B2 | 9/2004 | Henley et al. | |
| 6,893,503 B1 | 5/2005 | Ohnuma et al. | |
| 7,016,028 B2 | 3/2006 | Holsteyns et al. | |
| 2003/0226821 A1* | 12/2003 | Huang et al. | 216/59 |
| 2004/0241867 A1 | 12/2004 | Jones et al. | |
| 2007/0138465 A1* | 6/2007 | Li | 257/48 |
| 2008/0020497 A1 | 1/2008 | Miyazaki | |

FOREIGN PATENT DOCUMENTS

| | | |
|---|---|---|
| EP | 0869352 A1 | 10/1998 |
| EP | 1369682 A2 | 10/2003 |
| JP | 11030611 A | 2/1999 |

OTHER PUBLICATIONS

Abstract, Terry Gilton, et al., Utilizing Bath/Wafer Contamination Correlation to Validate a Pregate Cleaning Strategy (2009), 1 page.
International Search Report and Written Opinion mailed on Jul. 22, 2011 in International Application No. PCT/IB2010/055925 filed on Dec. 17, 2010.
Kelly, M. J., et al., Identification of Defects in SOI Wafers, Proceedings of the Fourth International Symposium on Silicon-on-Insulator Technology and Devices, May 11, 1999, pp. 120-128.

(Continued)

*Primary Examiner* — Kevin Parendo
(74) *Attorney, Agent, or Firm* — Armstrong Teasdale LLP

(57) ABSTRACT

Methods are disclosed for monitoring the amount of metal contamination imparted during wafer processing operations such as polishing and cleaning. The methods include subjecting a silicon-on-insulator structure to the semiconductor process, precipitating metal contamination in the structure and delineating the metal contaminants.

8 Claims, 7 Drawing Sheets

OTHER PUBLICATIONS

Graff, K., et al., Chromium-Free Etch for Revealing and Distinguishing Metal Contamination Defects in Silicon, Journal of the Electrochemical Society, Electrochemical Society, Oct. 1, 1994, pp. 2821-2825, vol. 141, No. 10.

Shabani, M. B., et al., Effect of Dopants and Oxygen Precipitation on Low-Temperature Out-Diffusion and Gettering of Cu in Silicon Wafer, Proceedings of the Fifth International symposium on High Purity Silicon, Nov. 2, 1998, pp. 313-318.

Invitation to Pay Additional Fees and, Where Applicable, Protest Fee, dated Apr. 19, 2011 in Corresponding International Application No. PCT/IB2010/055925.

Co-Owned U.S. Appl. No. 12/967,382, filed Dec. 14, 2010.
Co-Owned U.S. Appl. No. 13/105,381, filed May 11, 2011.
Co-Owned U.S. Appl. No. 13/105,392, filed May 11, 2011.
Office Action dated Oct. 13, 2011 in Co-Owned U.S. Appl. No. 13/105,392.

* cited by examiner

METHODS FOR MONITORING THE AMOUNT OF CONTAMINATION IMPARTED INTO SEMICONDUCTOR WAFERS DURING WAFER PROCESSING

CROSS-REFERENCE TO RELATED APPLICATION

This application claims the benefit of U.S. Application No. 61/289,878, filed Dec. 23, 2009, which is incorporated herein by reference in its entirety.

BACKGROUND

The present disclosure relates to methods for determining or monitoring the amount of metal contaminants imparted into semiconductor wafers during processing and, particularly, for monitoring the amount of metal contamination imparted during wafer processing operations such as polishing, cleaning, oxide stripping and the like by subjecting a silicon-on-insulator structure to the semiconductor process, precipitating metal contamination in the structure and delineating the metal contaminants.

Metal contamination in semiconductor wafers is detrimental as the contamination can cause yield losses in the resulting integrated circuits. Metal contamination has increasingly become a concern in view of the trend toward smaller devices, devices with faster operational speeds and lower manufacturing costs. Metal contamination may be introduced into semiconductor wafers in a number of processing steps including wafer polishing, cleaning, bond strength enhancing thermal treatment, epitaxy, oxide stripping, plasma activation, wet chemical etching, gas phase chemical etching, high temperature annealing, ion implantation, oxidation and the like.

Current methods for characterizing surface metal contamination involve contacting the wafer with an extraction fluid such as water or aqueous HF. Typically a drop of fluid is contacted with the wafer surface. During the contact period metals dissolve into the extraction fluid. The fluid may be analyzed by suitable means such as inductively coupled plasma mass spectrometry (ICP-MS) in which a plasma is used to produce ions which may be detected by a mass spectrometer. This detection method is limited in that it generally cannot detect contaminants at a concentration of less than $10^8$ atoms/cm$^2$. Moreover, conventional surface metal detection methods are unable to provide spatial distribution information regarding contaminants on the wafer surface. Bulk metal detection methods (e.g., bulk silicon digestion plus ICP-MS and SIMS depth profile methods) also are characterized by low sensitivity.

There is a continuing need for methods for characterizing metal contamination induced during various wafer manufacturing steps including, for example, polishing, cleaning, etching and the like and for methods that detect contamination below $10^8$ atoms/cm$^2$ and/or that are capable of providing spatial distribution information relating to contaminants on the wafer surface.

SUMMARY

One aspect of the present disclosure is directed to a method for determining or monitoring the amount of metal contamination in a process. A silicon-on-insulator structure is exposed to a processing step. The silicon-on-insulator structure includes a handle wafer, a silicon layer, and a dielectric layer between the handle wafer and the silicon layer. The structure has a front surface on the silicon layer. The processing step imparts metal contamination in the silicon layer. The silicon-on-insulator structure is thermally annealed to cause metal contaminants in the silicon layer to dissolve. The silicon-on-insulator structure is cooled to form metal precipitates in the silicon layer. The metal precipitates are delineated in the silicon layer.

A further aspect of the present disclosure is directed to a method for detecting metal precipitates in a semiconductor wafer having a front surface. The wafer is contacted with an aqueous HF solution to create pits, holes and/or cavities on the front surface of the wafer at or near the sites of metal precipitates at the front surface of the wafer. The front surface of the wafer is inspected for the presence of pits, holes and/or cavities.

Yet another aspect of the present disclosure is directed to a method for monitoring the amount of metal contamination imparted into wafers during a semiconductor process. At least one silicon-on-insulator structure is exposed to the semiconductor process. The silicon-on-insulator structure includes a handle wafer, a silicon layer and a dielectric layer between the handle wafer and the silicon layer. Metal contamination indicators of the silicon-on-insulator structures are evaluated and whether or not the amount of metal contamination imparted into semiconductor wafers is acceptable is verified.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
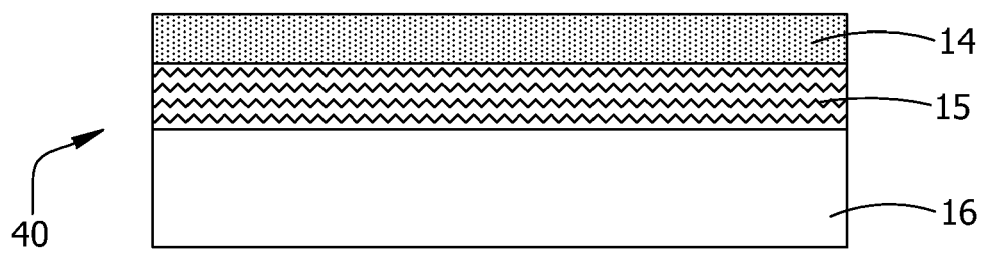
FIG. 1 is a SOI structure suitable for use in accordance with embodiments of the present disclosure.
Figure 2:
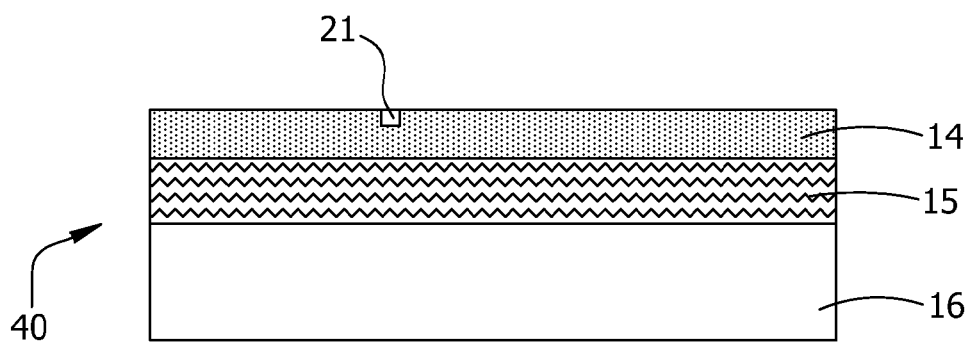
FIG. 2 is a SOI structure with a precipitate in the silicon layer.

Provisions of the present disclosure relate to methods for determining or monitoring the amount of metal contamination in a process and particularly a semiconductor process; whereas, other provisions relate to methods for detecting metal precipitates in a semiconductor wafer. Generally, the methods for monitoring include exposing a wafer and, particularly, a silicon-on-insulator ("SOI") structure, having a silicon layer (often referred to as a semiconductor layer or device layer), a dielectric layer (typically silicon dioxide or silicon nitride) and a substrate (sometimes referred to as a handle wafer or supporting layer) to a processing step to impart metal contamination in the structure. The wafer is thermally annealed and cooled to cause metal contaminants to precipitate in the wafer and, in the case of SOI structures, to precipitate in the silicon layer (i.e., semiconductor layer or device layer). It has been found that in the case of SOI structures, the dielectric layer acts to limit diffusion of metal contaminants and thereby traps the contaminants in the silicon layer. This allows for a greater concentration of contaminants to accumulate in the silicon layer which allows metals to precipitate upon a thermal anneal and cooling. According to embodiments of the present disclosure, the metal precipitates may be detected (synonymously "delineated") by contacting the wafer with an etchant to create pits, holes and/or cavities on the surface of the wafer near the sites of metal precipitates. The wafer may then be inspected for the presence of these pits, holes and/or cavities by known methods such as by light scattering techniques.

It should be understood that while the methods described herein are suitable for monitoring metal contamination in one or more semiconductor processing steps, the methods may be used to monitor contamination in other types of processes and the methods should not be viewed to be limited to semiconductor processes. While the methods of the disclosure are generally described in relation to semiconductor processes, they may similarly be applied to any type of process without limitation such as, for example, medical and biological environments which require low levels of contamination, particularly metal contamination. Such contamination monitoring may involve shaping of the silicon-on-insulator structure into a size and shape typical of the process (e.g., shaping into square substrates, chips and the like); however, in other embodiments such shaping is not performed. In this regard, references herein to "semiconductor processes" should not be viewed in a limiting sense.

In a first step for monitoring metal contamination of one or more processing steps (e.g., semiconductor processes), a silicon-on-insulator structure is exposed to one or more processing step(s) of interest (e.g., a semiconductor process) to gather information concerning the amount or relative amount of contamination the processing step imparts in semiconductor wafers. Generally, the processing step may be part of a manufacturing protocol for producing semiconductor wafers or devices. The wafers that are typically subjected to the processing step as part of the protocol may be and typically are wafers other than SOI structures such as, for example, single crystal silicon wafers, multi-crystalline wafers or epitaxial wafers. It should be understood that types of wafers normally subjected to the protocol and particularly to the semiconductor processing step include wafers that are not listed without limitation. In this regard, it should be noted that the "semiconductor processing step" may be part of a processing step in the production of photovoltaic cells and that use of the term "semiconductor" should not be viewed in a limiting sense.

The wafers typically subjected to the semiconductor process of the manufacturing protocol may have a diameter of about 75 mm or more, about 100 mm or more, about 150 mm or more, about 200 mm or more, about 300 mm or more or about 450 mm or more. In this regard, the SOI structure used to monitor the semiconductor process may have a diameter similar to or the same as wafers produced according to the manufacturing protocol.

Examples of suitable semiconductor processes and operations in which metal contamination may be monitored or determined include, for example, polishing, cleaning, bond strength enhancing thermal treatment, epitaxy, oxide stripping, plasma activation, wet chemical etching, gas phase chemical etching, high temperature annealing, ion implantation, oxidation and the like. In this regard, it should be noted that processes other than those listed may be monitored without limitation.

Generally, any type of metal may be detected by embodiments of the present disclosure. Suitable metals that may be detected include transition metals and, particularly, nickel, platinum, iron and combinations of these metals. In this regard, embodiments of the present disclosure should not be viewed to be limited to a certain type of metal contamination as the present disclosure may suitably detect any type of metal that may precipitate in silicon and whose precipitates strains the silicon layer of the SOI structure at or near the site of the precipitates.

As stated above, a SOI structure is exposed to a semiconductor process to determine or monitor the amount of metal contamination in a semiconductor process. It should be understood that while the present disclosure makes reference to "monitoring" a processing step for metal contamination or for "determining" the metal contamination in a semiconductor wafer, these terms should not be viewed in a limiting sense. Embodiments of methods of the present disclosure may be used to determine the amount of contamination imparted into wafers by correlating the results to the contamination amount as determined by other techniques or may be used to monitor the amount of contamination imparted by the processing step by comparing the data to baseline data and determining whether the data differs from the baseline.

The SOI structure may be exposed to the semiconductor process of interest by one of several methods. For instance, the SOI structure may be subjected to the same processing step including the same processing conditions as wafers that are typically subjected to the step as part of a semiconductor wafer manufacturing protocol. For example, if the semiconductor processing step is a mirror polish of an epitaxial wafer comprising a single silicon wafer with an epitaxial layer thereon, a SOI structure may be subjected to the mirror polish using the same polishing conditions including the length of polish, chemical reagents and the like. Alternatively, the SOI structure may be exposed to an atmosphere in which the semiconductor process is conducted. For instance, the SOI structure may be present in a "clean room" to verify that the wafers are not being subjected to unacceptable contamination or may be present within an apparatus in which the processing step is performed. In one or more alternative embodiments, the SOI structure is contacted with a source of fluid used in the processing step such as fluid used to rinse or to etch semiconductor wafers. The SOI structure may be contacted with the source of water for a period of time longer than in the manufacturing protocol so as to impart a sufficient amount of contamination in the silicon layer of the SOI structure as disclosed in U.S. application Ser. No. 12/967,382, entitled "Systems and Methods for Analysis of Water and Substrates Rinsed in Water," filed Dec. 14, 2010.

Silicon-on-insulator structures and methods for producing them are generally known by those skilled in the art (see, for example, U.S. Pat. Nos. 5,189,500; 5,436,175; 6,790,747, each of which is incorporated herein for all relevant and consistent purposes). A silicon-on-insulator structure suitable for use in embodiments of the present disclosure is generally referenced by numeral 40 in FIG. 1. The SOI structure 40 generally includes a thin layer of silicon 14 atop a dielectric or "insulating" layer 15 (e.g., an oxide layer) which is in turn disposed on a handle wafer 16 such as a silicon substrate.

An exemplary process of making a SOI structure includes depositing a dielectric layer (e.g., an oxide layer) on a polished front surface of a donor wafer. Particles (e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned in one or more cleaning operations to remove contaminants (e.g., organic compounds and other contaminant particles) deposited on the wafer during the implantation process.

The front surface of the donor wafer is then bonded to a handle wafer to form a bonded wafer through a hydrophilic bonding process. The donor wafer and handle wafer are bonded together by exposing the surfaces of the wafers to a plasma containing, for example, oxygen or nitrogen. Exposure to the plasma modifies the structure of the surfaces in a process often referred to as surface activation. The wafers are then pressed together and a bond is formed therebetween. This bond is relatively weak, and is strengthened before further processing occurs.

In some processes, the hydrophilic bond between the donor wafer and handle wafer (i.e., a bonded wafer) is strengthened by heating or annealing the bonded wafer pair at temperatures between approximately 300° C. and 500° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane. A portion of the donor wafer is then separated (i.e., cleaved) along the cleave plane from the bonded wafer to form the SOI structure.

The bonded wafer is first placed in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming a SOI structure. According to other methods, the bonded pair may instead be subjected to an elevated temperature over a period of time to separate the portion of the donor wafer from the bonded wafer. Exposure to the elevated temperature causes initiation and propagation of a crack along the cleave plane, thus separating a portion of the donor wafer.

The resulting SOI structure comprises a thin layer of silicon (the portion of the donor wafer remaining after cleaving) disposed atop the dielectric layer and the handle wafer. The cleave surface of the SOI structure (i.e., the thin layer of silicon of the donor wafer) has a rough surface that may be smoothed by additional processing.

It has been found that relatively thin silicon layers generally are characterized by a higher concentration of metal precipitates upon thermally annealing and cooling as described below as the distance between metal contaminants is less in thin layers. Accordingly, in one or more various embodiments of the present disclosure, the SOI structure that is exposed to the semiconductor process has a silicon layer with a thickness of less than about 250 nm, less than about 175 nm or even less than about 100 nm. It should be understood, however, that other thicknesses may be used without departing from the scope of the present disclosure. Optionally, the silicon layer may contain materials other than silicon such as carbon or germanium.

The dielectric layer 15 may be any electrically insulating material suitable for use in a SOI structure, such as a material comprising $SiO_2$, $Si_3N_4$, aluminum oxide, or magnesium oxide. In one embodiment, the dielectric layer is $SiO_2$ (i.e., the dielectric layer consists essentially of $SiO_2$). $SiO_2$ containing dielectric layers may suitably be more readily etched by the etchants described below relative to other materials which may form the dielectric layer. However, it is to be noted that in some instances, it may alternatively be preferable to use a material for the dielectric layer which has a melting point which is higher than the melting point of pure $SiO_2$ (i.e., higher than about 1700° C.). Examples of such materials are silicon nitride ($Si_3N_4$), aluminum oxide, and magnesium oxide. The dielectric layer is typically less than about 500 nm thick and, in certain embodiments, is less than about 300 nm thick, less than 200 nm thick or less than about 150 nm thick.

As stated above, it has been found that the dielectric layer of the SOI structure acts to limit diffusion of metal contaminants and traps the contaminants in the silicon layer. Once metal contaminants have been imparted into the SOI structure and, particularly, the silicon layer, the structure may be thermally annealed to dissolve the metal contaminants. After the thermal anneal, the structure may be cooled as explained below to cause the metal contaminants to precipitate in the silicon layer. In accordance with embodiments of the present disclosure, the temperature to which the SOI structure is annealed may range from about 800° C. to about the melting temperature of silicon (e.g., 1414° C.), and, in other embodiments, is from about 800° C. to about 1300° C., from about 800° C. to about 1150° C. or from about 850° C. to about 1050° C. It has been found that the thermal anneal acts to dissolve precipitates and metal contaminants that are present in the silicon layer prior to the thermal anneal (i.e., metal precipitates and metal contamination that cannot be attributed to the semiconductor process to which the SOI structure was exposed or, stated differently, "baseline" contamination) and to dissolve metal contamination imparted by the semiconductor process. In this manner, metal contamination may be evenly distributed throughout the silicon layer. Generally, temperatures above about 800° C. are believed to be able to reduce if not nearly eliminate precipitates present in the thermal anneal prior to the anneal; however, it should be understood that other temperatures may be used without departing from the scope of the present disclosure. For instance, temperatures as low as about 600° C. may be suitable to dissolve metal contaminants (and particularly certain types of metal contaminants) at the surface of the silicon layer into the silicon layer bulk. It is also believed that use of anneal temperatures below about 1300° C. allows the anneal to be conducted for relatively long periods of time (such that the time of anneal may not be controlled as in some embodiments of the disclosure) as there is less risk that metals may diffuse into and through the dielectric layer at temperatures below about 1300° C. Further, it is believed that thermally annealing at a temperature above about 1300° C. may introduce thermal defects and contamination into the structure which may affect the defect pattern. In this regard, it should be understood that anneal temperatures above about 1300° C. may be used without departing from the scope of the present disclosure.

Generally the metal precipitates and contaminants are capable of dissolving once the anneal temperature is reached; however, in certain embodiments, the SOI structure is held at the anneal temperature (or in certain embodiments above a minimum anneal temperature) for at least about 1 second, at least about 5 seconds, at least about 30 seconds, at least about 1 minute, at least about 5 minutes or even up to an hour or more.

The thermal anneal may be performed under an atmosphere of any gas and, in certain embodiments, is performed under an atmosphere that contains hydrogen, argon, nitrogen or mixtures thereof Optionally, the atmosphere may contain an amount of oxygen to form an oxide layer on the surface of the silicon layer so as to trap metal contaminants in the silicon layer. In one or more embodiments, the atmosphere consists essentially of hydrogen. The anneal may be performed at about atmospheric pressure; however, it should be understood that pressures other than atmospheric pressure may be used including pressures up to about 0.2 MPa, up to about 1 MPa, up to about 10 MPa or more or vacuums of less than about 50 kPa, less than about 1 kPa, less than about 0.1 kPa or even less may be used without limitation.

After the anneal is completed, the SOI structure may be cooled to a temperature at which the metal contaminants are supersaturated in the silicon layer. Once this supersaturation condition is achieved, a precipitation event may occur in which metal contaminants combine. Metals of the same type may combine or different types of metals may combine to form a precipitate alloy and or co-precipitate without limitation. Generally, the SOI structure may be cooled to a supersaturation temperature at a cooling rate sufficiently low enough to allow the mobile contaminants to combine. Supersaturation temperatures may vary depending on the concentration of contaminants and may be determined experimentally. Generally, supersaturation conditions occur at a temperature from about 600° C. to about 1100° C.

In certain embodiments, the SOI structure is cooled through the range of temperatures through which metal contaminants are relatively mobile in silicon at a specified rate that allows the metal precipitates to combine. While not being bound to a particular theory, it is believed that different metal contaminants may be relatively mobile in silicon over varying temperatures which may be determined experimentally; however it is believed that most metal contaminants are relatively mobile in silicon at temperatures above about 600° C. In certain embodiments and depending on the type and concentration of contaminants present in the silicon wafer, metal contaminants may be relatively mobile at temperatures above about 500° C., above about 350° C. or even above temperatures as low as about 200° C. Generally, the metal contaminants are considered to be immobile when the metal diffusion rate is sufficiently slow to prevent further nucleation and growth of the precipitates.

In some embodiments, the cooling rate of the SOI structure from the supersaturation temperature (i.e., the maximum temperature at which the supersaturation condition occurs as the wafer is cooled) through the range of temperatures through which metal contaminants are relatively mobile in silicon is less than about 7° C./sec (as measured from the point at which the SOI structure begins to cool to the point at which metal contaminants are no longer mobile (e.g., about 600° C.)). Without being bound to any particular theory, it is believed that at cooling rates above about 7° C./sec, precipitation nucleation may be inhibited. In other embodiments, the cooling rate from the supersaturation temperature through the range of temperatures through which metal contaminants are relatively mobile in silicon is less than about 5° C./sec, less than about 1° C./sec, less than about 0.5° C./sec or even less than about 0.1° C./sec. In some embodiments, the cooling rate may range from about 0.05° C./sec to about 10° C./sec, from about 0.5° C./sec to about 7° C./sec or from about 1° C./sec to about 5° C./sec. It should be noted that the controlled cooling may extend to ambient conditions without departing from the scope of the present disclosure. Further, the cooling rates described above may also extend from the anneal temperature to the point at which metal contaminants are no longer mobile (e.g., about 600° C.)).

In addition or alternatively, the cooling rate may be characterized by a saturation temperature at which metal contaminants are supersaturated in the silicon layer ($T_{sat}$), by a temperature at which metal contaminants are no longer mobile in silicon ($T_{immobile}$), and by the length of time ($t_{cool}$) in which the wafer is cooled from about $T_{sat}$ to about $T_{immobile}$. In some embodiments, ($T_{sat}$-$T_{immobile}$)/$t_{cool}$ may be less than about 7° C./sec and in others less than about 5° C./sec, less than about 1° C./sec, less than about 0.5° C./sec or less than about 0.1° C./sec. In some embodiments, ($T_{sat}$-$T_{immobile}$)/$t_{cool}$ may range from about 0.05° C./sec to about 10° C./sec, from about 0.5° C./sec to about 7° C./sec or from about 1° C./sec to about 5° C./sec.

In this regard, the cooling rate may be controlled through a larger range of temperatures that encompasses the range $T_{sat}$ to about $T_{immobile}$, particularly if the saturation temperature is unknown. For example, the cooling rate may be characterized by the temperature of the SOI structure upon completion of the thermal anneal, $T_{anneal}$ in addition to the temperature at which metal contaminants are no longer mobile in silicon ($T_{immobile}$), and by the length of time, $t_{cool}$, in which the wafer is cooled from about $T_{anneal}$ to about $T_{immobile}$. In some embodiments, ($T_{anneal}$-$T_{immobile}$)/$t_{cool}$ may be less than about 7° C./sec and in others less than about 5° C./sec, less than about 1° C./sec, less than about 0.5° C./sec, less than about 0.1° C./sec, or from about 0.05° C./sec to about 10° C./sec, from about 0.5° C./sec to about 7° C./sec or from about 1° C./sec to about 5° C./sec.

Once the metal precipitates have formed by annealing and cooling, the metal precipitates may be delineated. In accordance with embodiments of the present disclosure, delineation may be performed by contacting the surface of the SOI structure (i.e., the surface of the silicon layer) with an etchant that selectively creates a pit, hole or cavity at or near the site of metal precipitates that are near the surface of the silicon layer. The etchant may be gaseous or may be a solution. Suitable etching solutions may include a compound selected from the group consisting of HF, $K_2Cr_2O_7$, $CrO_3$, $HNO_3$, $CH_3COOH$, $Cr_2O_3$, $AgNO_3$ and mixtures thereof. The surface of the SOI structure may be contacted with the etchant by immersing (or at least partially immersing) the SOI structure in an etchant bath or by selectively etching the surface by contacting the surface with an etchant gas. Batch-immersion (cleaning benches) may be used for etching and spin etching techniques may also be used without departing from the scope of the present disclosure. It is generally not necessary to mask the edge of the wafer during etching as the dielectric layer may be sealed by material collapsed from the silicon layer.

In some particular embodiments, the solution is an aqueous HF solution. The concentration of HF in the solution (by weight) may be less than about 50% and, in other embodiments, is less than about 25%, less than about 10%, less than about 5% or less than about 2%. In certain embodiments, the concentration of HF in the solution (by weight) may range from about 0.1% to about 5% or from about 0.5% to about 2%. In some particular embodiments, the concentration of HF (by weight) is about 1%. The HF solution may contain one or more other components such as complexing ligands or surfactants; however, in certain embodiments the etchant consists essentially of water and HF. The etchant may also be a gas that is contacted with the silicon layer. Suitable gases include HF gas that may be diluted in a carrier gas such as hydrogen, argon or nitrogen.

The period of time for which the etchant contacts the silicon layer may vary according to the corrosiveness of the etchant and its concentration. Generally, for the etchants known as Secco etchants (e.g., that contain $K_2Cr_2O_7$ or $Cr_2O_3$) and for etchants that contain $CrO_3$, $HNO_3$, $CH_3COOH$ or $AgNO_3$ the etchant is contacted with the SOI structure for a relatively short period of time such as, for example, at least about 1 second, at least about 5 seconds, at least about 10 seconds or at least about 20 seconds. In other embodiments, the period of time may range from at least about 1 second to about 2 minutes, from about 1 second to about 1 minute or from about 10 seconds to about 1 minute.

In embodiments where aqueous HF is used, the solution may be contacted with the SOI structure for a relatively longer period of time. For instance, the surface of the silicon layer may be contacted with the etchant for at least about 1 hour, at least about 4 hours or at least about 8 hours. In some embodiments, the period of contact of the HF solution and the silicon layer may range from about 8 hours to about 16 hours.

Generally, the etchant (whether HF or another etchant) is contacted with the SOI structure at room temperature, however higher temperatures may be used such as up to about 50° C., up to about 100° C., up to about 150° C. or more.

Without being bound to any particular theory, it is believed that the etchant acts to create a pit or hole at the site or near the site of metal precipitates that are at the surface of the silicon layer. The etchant preferentially etches the area at or near metal precipitates as this area tends to be strained (i.e., the crystal lattice is weaker) at or near the sites of metal precipitates. This hole or pit may begin to extend toward the dielectric layer. Certain etchants (e.g., HF) may cause the dielectric layer to dissolve thereby undercutting the site of the metal precipitate and eventually causing the material above the undercut portion to cave downward thereby forming a cavity (synonymously "divot"). Other etchants (such as the Secco-type etchants) are not capable of substantially dissolving the dielectric layer and form small holes or pits rather than cavities. In this regard, it should be understood that the terms "pits," "holes" or "cavities" should not be viewed in a limiting sense. Generally, these terms encompass any modification of the silicon layer at the site of metal precipitates that result in light scattering (e.g., light point defects) upon reflection of light off the SOI structure surface.

In some embodiments, the SOI structure is contacted with two different types of etchants for periods of time. For instance, the SOI structure may be contacted with a Secco-type etchant (e.g., that contains $K_2Cr_2O_7$ or $Cr_2O_3$) to form small holes in the surface of the SOI structure at or near the site of metal precipitates and then may be contacted with an etchant solution containing HF to dissolve a portion of the dielectric layer thereby creating a cavity or divot at or near the site of the metal precipitate.

Figure 3:
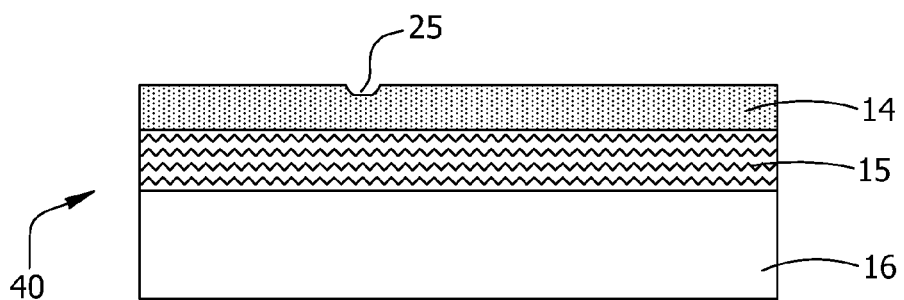
FIG. 3 is a SOI structure with a hole or pit formed after etching.
Figure 4:
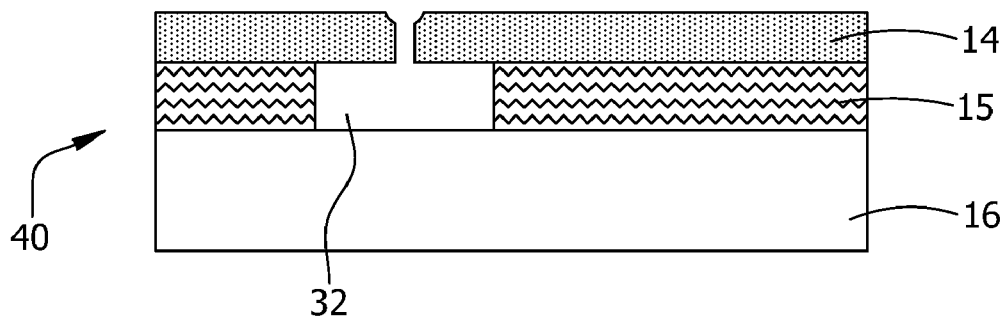
FIG. 4 is a SOI structure with an undercut precipitate after further etching.
Figure 5:
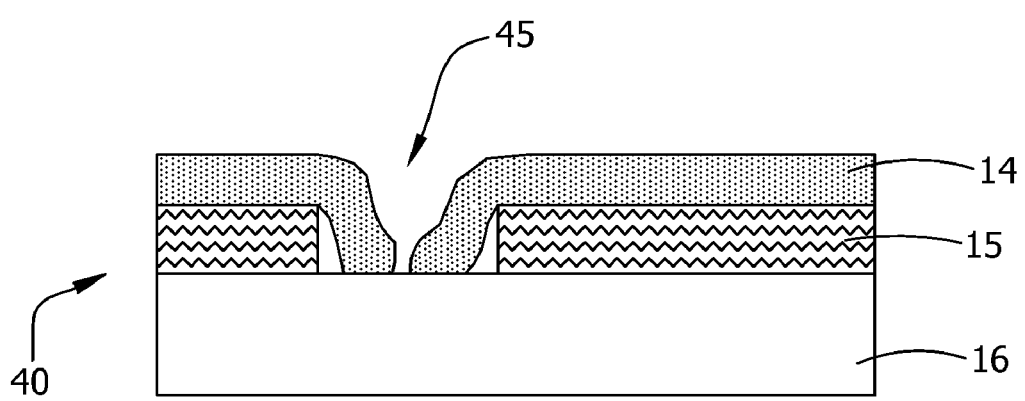
FIG. 5 is a SOI structure with a cavity or divot formed after etching of the dielectric layer.

The delineation process is generally shown in FIGS. 2-5. A metal precipitate 21 (FIG. 2) may be delineated by contacting the silicon layer 14 with an etchant so as to form a hole or pit 25 at or near the site of the metal precipitate (FIG. 3). The etchant eats away the silicon layer 14 and eventually undercuts it by etching the dielectric layer (FIG. 4). This undercutting 32 eventually leads to the silicon layer partially collapsing and forming a cavity 45 (FIG. 5).

Once the pits, holes and/or cavities have been formed, the surface of the SOI structure may be inspected for the presence of pits, holes and/or cavities. Suitable inspection may involve directing light to the front surface of the silicon-on-insulator structure and detecting scattered reflected light which is detected as a "light point defect" or "LPD." Equipment that can perform such analysis includes wafer laser-based inspection tools such as ADE Optical Systems (AOS) or KLA-Tencor SP1 Series, both manufactured by KLA-Tencor Corporation (San Jose, Calif.). In this regard, it should be understood that other equipment and methods may be used to detect pits, holes and/or cavities without limitation including, for example, optical microscopes, scanning electron microscopes and the like which may provide spatial distribution information by examining multiple field of view. In certain embodiments, the light scattering may be correlated to the amount of contamination imparted into the silicon-on-insulator structure.

It is believed that the methods of the present disclosure are capable of detecting metal contamination as low as about $1 \times 10^7$ atoms per $cm^2$ of SOI structure surface and, in other embodiments, as low as about $3 \times 10^7$ atoms/$cm^2$, as low as about $7 \times 10^7$ atoms/$cm^2$ or as low as $1 \times 10^8$ atoms/$cm^2$. It should be noted that the precise lower limit of contamination that the methods of the present disclosure are capable of detecting is difficult to determine as conventional detection techniques are generally not capable of detecting metal contamination below about $10^8$ atoms/$cm^2$. In this regard, it should be noted that the disclosed methods are also capable of providing information related to the spatial distribution of pits, holes and/or cavities (see Example 1 and FIGS. 6-7). The information may be analyzed to determine the metal-contaminating effect of the semiconductor process.

Once the metal precipitates are delineated and the surface of the wafer is inspected for the resulting pits, holes or cavities, this information may be used to confirm that the semiconductor process is not imparting unacceptable amounts of metal contamination in semiconductor wafers subject to the manufacturing protocol. If the level of contamination is determined to be too high, process conditions may be adjusted to reduce the amount of contamination. In this regard, it may be beneficial to determine a baseline level of metal contamination that is acceptable and correlate this baseline metal contamination to a baseline amount of light scattering present on the surface of a SOI structure that is subjected to the semiconductor process, annealed, cooled and precipitate-delineated.

In an exemplary process for confirming whether the semiconductor process is imparting unacceptable amounts of metal contamination, at least one SOI structure is exposed to the semiconductor process. Metal contamination indicators (e.g., metal precipitates; pits, cavities and/or holes; or scattered light reflected from the surface of the silicon-on-insulator structure) are evaluated and may be used to establish baseline and threshold concentrations of such indicators and/or contaminants. This information may be used to verify whether the amount of metal contamination imparted into semiconductor wafers subsequently exposed to the same process is acceptable. The semiconductor process may then be adjusted to reduce that amount of metal contamination induced into wafers during the semiconductor process if the amount of metal contamination was determined to be unacceptable. The relative amount of metal contamination may be verified by comparing the metal contamination indicators to metal contamination indicators gathered when the level of contamination was determined to be acceptable. As described above, after the SOI structure is exposed to the semiconductor process, metal precipitates may be formed in the SOI structure by thermally annealing the SOI structure to cause metal contaminants in the silicon layer to dissolve and by cooling the SOI structure such that the concentration of metal contaminants in the silicon layer may exceed a critical supersaturation level. The precipitates may be delineated as described above and laser light-based inspectors may be used to detect the presence of pits, holes and/or cavities formed at or near the site of metal precipitates.

Figure 6:
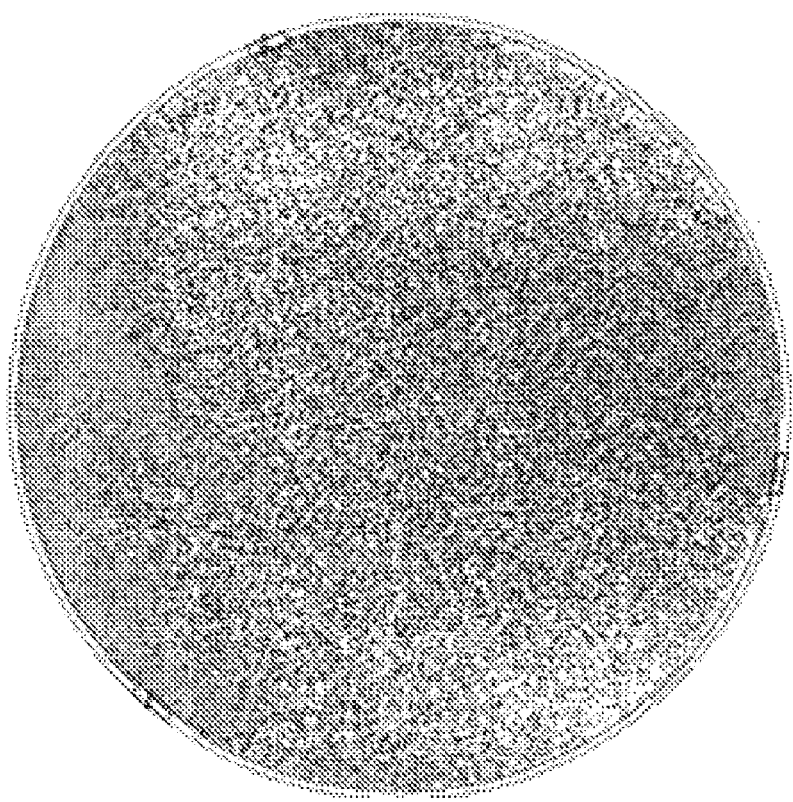
FIG. 6 is a defect map of a SOI structure that was soaked in a contaminated wafer cleaning bath according to Example 1.
Figure 7:
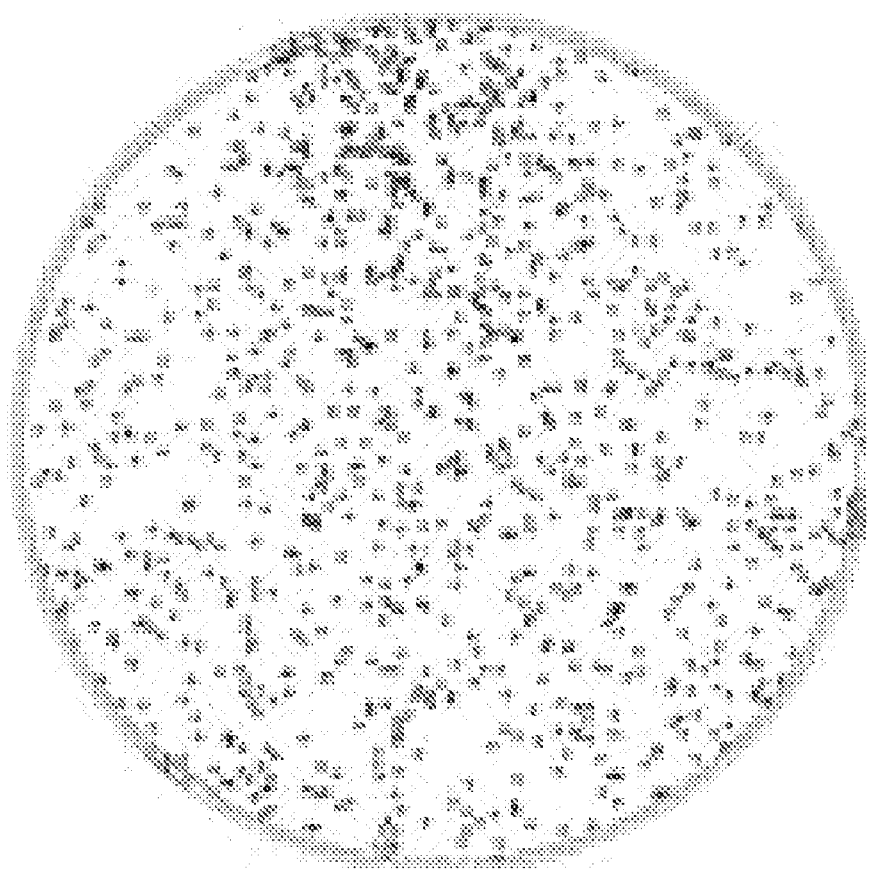
FIG. 7 is a defect map of a SOI structure that was soaked in a clean wafer cleaning bath according to Example 1.

In one or more embodiments, a defect map that shows the spatial distribution of metal precipitates (as determined by light scattering events) on the surface of the wafer may be produced (see Example 1 and FIGS. 6-7). Metal contamination may be verified by comparing the defect map to a defect map produced when the level of contamination was determined to be acceptable. Typically the respective defect maps will be prepared under substantially the same conditions such as, for example, using the same semiconductor process (polishing, cleaning, etc.), using substantially the same anneal times, temperatures and cooling times.

Wafer inspection instruments generally measure light point defects that are attributed to any type of metal. To differentiate the types of metals that are present in the SOI structure, the site of a pit, hole and/or cavity may be viewed by, for example, atomic force microscope, to analyze the morphology of the pit, hole or cavity. Without being bound to any particular theory, it is believed that different types of metals are characterized by a distinct morphology at the site of the pit, hole or cavity.

In accordance with the present disclosure, methods for detecting metal precipitates in a semiconductor wafer are also provided. While the above methods of delineation were described in context to the method of monitoring or determining metal contamination by use of a SOI structure, it should be understood that metal precipitates in other types of wafers including non-SOI single crystal silicon wafers, multicrystalline wafers or epitaxial wafers may detected. In one preferred embodiment, precipitates in a semiconductor wafer having a front surface are detected (i.e., delineated) by contacting the wafer with an aqueous HF solution to create pits, holes and/or cavities on the front surface of the wafer at or near the sites of metal precipitates at the front surface of the wafer. The front surface of the wafer may then be inspected for the presence of pits, holes and/or cavities. The concentration of the HF solution and etching time are generally described above. Once the pits, holes and/or cavities are formed, their presence may be detected by directing light to the front surface of the wafer to detect scattered reflected light.

EXAMPLES

Example 1

Detection of Metal Contamination in a Wafer Cleaning Step

A silicon-on-insulator structure having a silicon layer of a thickness of 88.0 nm was soaked for 9 minutes in a SC-1 wafer cleaning bath (i.e., aqueous mixture of $NH_4OH$ and $H_2O_2$) that contained trace amounts of nickel. The amount of metals in the surface of the wafer was measured by ICP-MS and was determined to be less than $3 \times 10^8$ atoms/cm$^2$.

The SOI structure was placed in the reaction chamber of an epitaxial reactor and heated to 1100° C. in an $H_2$ ambient for 1 minute. The wafer was allowed to cool in the reactor by radiative and convective cooling to a temperature of 200° C. and was removed from the reaction chamber. The wafer was subjected to a 12 hour soak in an HF aqueous solution (1 wt %). The wafer was rinsed and was inspected (KLA-SP2). The defect map is shown in FIG. 6. The defect map shows a high number of counts despite the wafer being lightly contaminated. The defect map is highly patterned with darker regions indicating higher amounts of contamination.

A second SOI structure that was processed in a SC-1 bath that was not contaminated was also heated and exposed to a HF bath under the same process conditions. The structure was also inspected for surface defects (KLA-SP2). The defect map is shown in FIG. 7. The structure showed less defects with little variation in the counts.

When introducing elements of the present disclosure or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above apparatus and methods without departing from the scope of the disclosure, it is intended that all matter contained in the above description and shown in the accompanying figures shall be interpreted as illustrative and not in a limiting sense.

What is claimed is:

1. A method for monitoring an amount of metal contamination imparted into wafers during a semiconductor process, the method comprising:
   exposing at least one silicon-on-insulator structure to the semiconductor process, the silicon-on-insulator structure comprising a handle wafer, a silicon layer, and a dielectric layer between the handle wafer and the silicon layer, the semiconductor process imparting metal contaminants in the silicon layer;
   evaluating metal contamination indicators of the silicon-on-insulator structures, the evaluation including:
   thermally annealing the silicon-on-insulator structure to cause the metal contaminants in the silicon layer to dissolve;
   cooling the silicon-on-insulator structure to form metal precipitates in the silicon layer; and
   detecting the metal precipitates, the detecting step creating pits, holes and/or cavities on the front surface of the silicon-on-insulator structure and involving directing light to the front surface of the silicon-on-insulator structure and detecting scattered reflected light;
   producing a first defect map by use of the scattered reflected light;
   verifying whether the amount of metal contaminants imparted into semiconductor wafers is acceptable by comparing the first defect map to a second defect map produced when the level of contamination was determined to be acceptable, the first and second defect maps being produced using substantially the same process conditions including the thermal anneal temperatures, the thermal anneal times, cooling rates and process for detecting the metal precipitates.

2. The method as set forth in claim 1 wherein the metal precipitates are detected by contacting the surface of the silicon layer with an etchant.

3. The method as set forth in claim 1 wherein the thermal annealing step occurs at a temperature from about 600° C. to about 1300° C.

4. The method as set forth in claim 1 wherein the cooling involves cooling in a range of temperatures in which the metal contaminants are relatively mobile in silicon to a final temperature at which the metal contaminants are no longer relatively mobile.

5. The method as set forth in claim 1 wherein there exists a temperature, $T_{sat}$, at which the metal contaminants are supersaturated in the silicon layer and a temperature, $T_{immobile}$, at which the metal contaminants are no longer mobile in silicon, the method comprising cooling the silicon-on-insulator structure from about $T_{sat}$ to about $T_{immobile}$ over a length of time, $t_{cool}$, upon completion of the thermal anneal, wherein $(T_{sat}-T_{immobile})/t_{cool}$ is less than about 7° C./sec.

6. The method as set forth in claim 1 wherein the silicon-on-insulator structure is at temperature, $T_{anneal}$, upon completion of the thermal anneal and there exists a temperature, $T_{immobile}$, at which metal contaminants are no longer mobile in silicon, the method comprising cooling the silicon-on-insulator structure from about $T_{anneal}$ to about $T_{immobile}$ over a length of time, $t_{cool}$, upon completion of the thermal anneal, wherein $(T_{anneal}-T_{immobile})/t_{cool}$ is less than about 7° C./sec.

7. The method as set forth in claim 1 wherein the silicon layer comprises an amount of metal contaminants, the amount of metal contaminants in the silicon layer of the silicon-on-insulator structure being less than about $10^8$ atoms/cm$^2$ after the silicon-on-insulator structure is exposed to the semiconductor process.

8. The method as set forth in claim 1 wherein the semiconductor process is selected from a group consisting of polishing, cleaning, bond strength enhancing thermal treatment, epitaxy, oxide stripping, plasma activation, wet chemical etching, gas phase chemical etching, high temperature annealing, ion implantation and oxidation.

* * * * *